United States Patent
Kawahara et al.

(10) Patent No.: US 7,723,132 B2
(45) Date of Patent: May 25, 2010

(54) SEMICONDUCTOR LASER AND THE METHOD FOR MANUFACTURING THE SAME

(75) Inventors: Takahiko Kawahara, Yokohama (JP); Nobuyuki Ikoma, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 158 days.

(21) Appl. No.: 12/213,692

(22) Filed: Jun. 23, 2008

(65) Prior Publication Data
US 2008/0299692 A1 Dec. 4, 2008

Related U.S. Application Data

(62) Division of application No. 11/324,800, filed on Jan. 4, 2006, now Pat. No. 7,460,575.

(30) Foreign Application Priority Data
Jan. 5, 2005 (JP) ............... 2005-000952

(51) Int. Cl.
*H01L 21/00* (2006.01)
(52) U.S. Cl. ............... 438/22; 438/32; 438/41; 257/E21.053; 257/E21.351
(58) Field of Classification Search ............ 438/22–24, 438/32, 37, 41–47; 257/E21.053, E21.351, 257/E21.352, E21.366
See application file for complete search history.

(56) References Cited

U.S. PATENT DOCUMENTS

| 4,794,618 A | 12/1988 | Mito |
| 5,336,635 A | 8/1994 | Anayama et al. |
| 5,841,152 A | 11/1998 | Ishikawa |
| 5,972,731 A * | 10/1999 | Dutta ............... 438/39 |
| 6,625,189 B1 | 9/2003 | Kito et al. |
| 2005/0286582 A1 | 12/2005 | Hayakawa et al. |

FOREIGN PATENT DOCUMENTS

JP 11-112098 4/1999

* cited by examiner

*Primary Examiner*—Hoai v Pham
(74) *Attorney, Agent, or Firm*—Smith, Gambrell & Russell, LLP

(57) ABSTRACT

The present invention is to provide a semiconductor laser with a feedback grating comprised of InP and AlGaInAs without InAsP put therebetween, and to provide a method for manufacturing the DFB-LD having such grating. The LD includes an n-type InP substrate, an AlInAsP intermediate layer, an AlGaInAs lower SCH layer, an active layer, and a p-type layer for upper cladding in this order from the InP substrate. The InP substrate, the AlInAsP intermediate layer, and the AlGaInAs lower SCH layer constitute the feedback grating. The AlInAsP intermediate layer lowers a series resistance along these semiconductor stacks.

6 Claims, 6 Drawing Sheets

SEMICONDUCTOR LASER AND THE METHOD FOR MANUFACTURING THE SAME

CROSS REFERENCE TO RELATED APPLICATION

This application is a division of Ser. No. 11/324,800, filed Jan. 4, 2006 now U.S. Pat. No. 7,460,575 and which is being incorporated in its entirety herein by reference.

BACKGROUND OF THE INVENTION

1. Field of the Invention

The present invention relates to a structure of a semiconductor laser diode and a method for producing the laser diode.

2. Related Prior Art

Japanese Patent published as A-H11-112098 has disclosed a distributed feedback (DFB) laser formed on the InP substrate. On the InP substrate with a feedback grating is grown in sequence the guiding layer, the spacer layer, and the MQW layer. The temperature profile to grow these layers shows a steep rise within 2 minutes and without any overshooting to the condition under which each layer is grown and makes the temperature drift stable within ±5° C. Moreover, the InGaAsP guiding layer starts its growth before the mass transportation of indium atoms occurs. Thus, the method disclosed in this patent prevents the decomposed InAsP layer from piling in the valley portion of the grating when the double hetero structure for the DFB-LD is formed on the InP substrate with the grating by the Organic Metal Vapor Phase Epitaxy (OMVPE) method.

The background of the present invention is that, in the DFB-LD, to keep the shape of the feedback grating is quite important for the single mode emission. When the InP substrate with the undulation for the feedback grating on the surface thereof is raised in the temperature as supplying the gas sources for the group V element, such as arsine $AsH_3$ and phosphine $PH_3$, an InAsP decomposed layer may be piled in the valley portion of the undulation, which degrades the shape of the feedback grating. The refractive index necessary to diffract light may be unable to obtain, consequently, the single mode oscillation can not be secured. Therefore, various methods has been proposed to maintain the dimensional quality of the feedback grating, in particular, the flow rate of the gas source for the group V element may be adjusted during the raising of the growth temperature.

When a semiconductor layer is grown immediately on the InP substrate with the grating on the surface thereof by the OMVPE method, the layer ordinarily called as the guide layer, first, the InP substrate is raised in the temperature thereof under an atmosphere including the group V element. The practical growth of the guide layer does not start until the temperature of the InP substrate becomes satisfactorily stable. This is because an overshoot of the temperature, i.e., the temperature of the substrate exceeds the growth temperature, occasionally appears in a range from several decades to around a hundred centigrade. Therefore, it is necessary to set a waiting time of about 10 minutes for the temperature being stable enough, and by adjusting the flow rate of the gas source of the group V element during this waiting, the dimensional quality of the grating may be secured.

The semiconductor material system for the DFB-LD of the present invention includes a separated confinement heterostructure (SCH) layer made of AlGaInAs, which is quite different from the conventional system made of InGaAsP/InP. When this SCH layer is grown on the substrate with the grating, an intermediate layer of the InAsP is formed to secure the dimensional shape of the grating during the raising of the temperature as supplying the phosphine $PH_3$ containing a minute amount of the arsine $AsH_3$. The grating is comprised of the InP substrate, the InAsP intermediate layer, and the AlGaInAs SCH layer. However, the series resistance of this DFB-LD along the stacking direction of semiconductor layers does not show an anticipated resistance. This may be due to the band structure between the InAsP and the AlGaInAs. Therefore, an object for the DFB-LD including AlGaInAs material is an innovative band structure to overcome the subject between the InAsP and the AlGaInAs.

The present invention, performed to solve the above subject, is to provide a semiconductor laser diode with a feedback grating comprised of the AlGaInAs and the InP without the InAsP, and to provide a method for manufacturing such laser diode with a new structure.

SUMMARY OF THE INVENTION

One aspect of the present invention relates to a configuration of a semiconductor laser diode (LD) with a feedback grating. The LD comprises a substrate with an undulation for the feedback grating, a lower separated confinement (SCH) layer, an active layer, and an upper SCH layer stacked in this order on the substrate. The LD of the invention further includes an intermediate layer between the substrate and the lower SCH layer. The substrate, the intermediate layer, and the lower SCH layer constitute the feedback grating, and may be an n-type InP, an AlInAsP, and an AlGaInAs, respectively.

Since the AlInAsP intermediate layer may prevent the dimensional quality of the undulation during the growth of the lower SCH layer from degrading, the optical coupling efficiency between the grating and the active layer may be secured, consequently, the single mode oscillation of the LD may be maintained. Moreover, the band structure of these semiconductor materials, in particular, the relation between the bottom levels of each conduction band ensures the resistance along the stacking of layers to be small. That is, the bottom level of the conduction band of the AlInAsP intermediate layer is higher than that of the InP substrate and, at the same time, is lower than that of the AlGaInAs lower SCH layer, which makes no valleys nor peaks in the conduction band. Accordingly, the resistance thereof may be suppressed.

The AlInAsP intermediate layer may have a thickness thinner than 10 nm such that the existence of the AlInAsP intermediate layer between the InP substrate and the AlGaInAs lower SCH layer does not affect the optical structure therebetween, in particular, the refractive indices thereof. Moreover, The band gap wavelength of the AlGaInAs lower SCH layer is preferably longer than 1.2 μm for the structure of bottom levels of the conduction band of each layer.

Another aspect of the invention relates to a method for manufacturing the LD with the feedback grating. The method comprises steps of; (a) forming an undulation on a surface of the InP substrate, (b) epitaxially growing an AlInAsP intermediate layer onto the undulated surface of the InP substrate, and (c) epitaxially growing a lower SCH layer on the AlInAsP intermediate layer. The epitaxial growth of the AlInAsP intermediate layer may be carried out by supplying with a mixed gas of arsine, phosphine, and organoaluminum.

The method may further include, after forming the undulation on the surface of the substrate and before growing the intermediate layer, a step for raising temperature of the substrate to a first preset value as supplying with hydrogen, and subsequently, to a second preset value, which is higher than the first value, as supplying with hydrogen, and phosphine, until the temperature of the substrate sufficiently stable. Accordingly, the dissociation of phosphorus atoms from the surface of the InP substrate may be prevented. The growth of the AlInAsP intermediate layer may be carried out by supplying with arsine, phosphine, and organoaluminum at the second preset temperature.

The substrate grown with the AlInAsP intermediate layer on the undulation of the surface thereof may be raised in the temperature thereof to a third preset value, which is higher than the second preset value, as supplying with hydrogen, arsine, and phosphine. The growth of the AlGaInAs layer may be carried out at the third temperature. Since the AlInAsP intermediate layer is provided on the surface of the InP, the mass-transportation of indium atoms may be prevented, thereby maintaining the dimensional quality of the undulation for the feedback grating and the optical coupling efficiency between the grating and the active layer formed on the grating. Accordingly, the LD may secure the single mode oscillation.

DESCRIPTION OF PREFERRED EMBODIMENTS

The spirits of the present invention will be easily understood by taking the following description into account as referring to accompanying drawings. Next, an embodiment according to a structure of a semiconductor optical device of the present invention and a method for manufacturing the optical device will be described as referring to drawings. In the explanation below, a semiconductor laser diode (hereinafter denoted as LD) is raised as an example of the semiconductor optical device. If possible, the same numerals or the same symbols will refer the same elements without overlapping explanations.

First Embodiment

Figure 1:
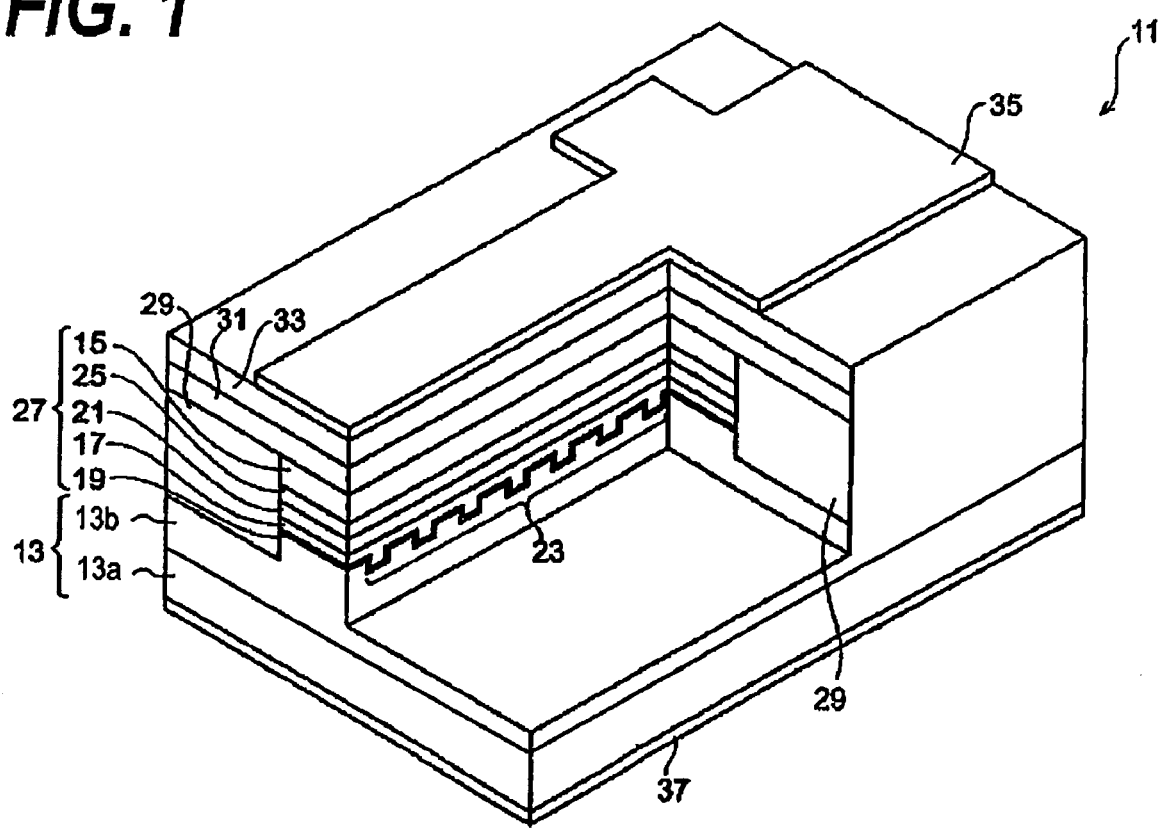
FIG. 1 is a partial cross section showing a structure of the laser diode according to the first embodiment of the invention.

FIG. 1 is a partial sectional view of a semiconductor laser diode (LD) according to the first embodiment of the present invention. The LD 11 includes an n-type InP region 13, a p-type III-V compound semiconductor layer 15, an upper separated confinement (SCH) layer 25, an AlGaInAs layer 17, an AlInAsP layer 19, which operates an a lower SCH layer, and an active layer 21. The AlInAsP layer 19 is formed between the n-type InP region 13 and the AlGaInAs layer 17. The active layer 21 is formed between the upper SCH layer 25 and the AlGaInAs layer 17. The n-type InP region 13, the AlInAsP layer 19, and the AlGaInAs layer 17 constitute a distributed feedback grating 23. This feedback grating 23 optically couples with the active layer 21.

As explained later, the LD 11 has a band structure that a difference between the bottom level of the conduction band of the AlGaInAs layer 17, which is denoted as $E_C^{(AlGaInAs)}$ and that of the AlInAsP layer 19, denoted as $E_C^{(AlInAsP)}$, is smaller than a difference between the bottom level of the conduction band of the InAsP, which is denoted as $E_C^{(InAsP)}$ and ordinarily appeared in the convention LD with the feedback grating, and that of the InP region, $E_C^{(InP)}$.

To form the feedback grating 23, it is necessary to make an undulation on the surface of the InP region 13. By disposing the AlInAsP layer 19 onto the undulation of the InP region 13, the mass-transportation of indium atoms may be prevented during the raising of the temperature for the next growth of the AlGaInAs layer 17. Consequently, the AlGaInAs layer 17 is formed onto the AlInAsP layer 19 with high quality. The n-type InP region 13 includes an n-type InP substrate 13a and an n-type InP layer 13b provided on the n-type InP substrate 13a.

Figure 2A:
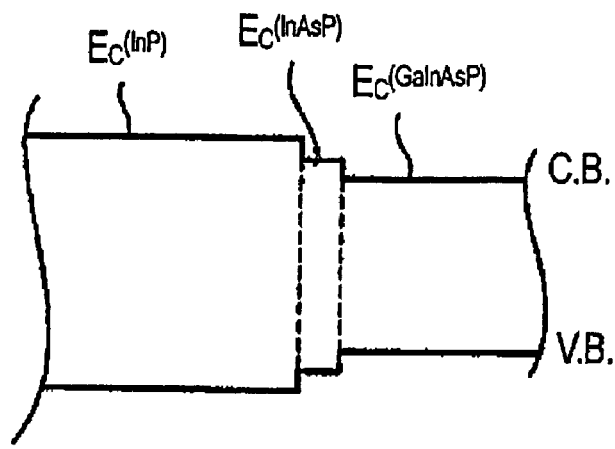
FIG. 2A shows an energy band diagram of the InP/InGaAsP system, which constitutes the feedback grating of the laser diode.
Figure 2B:
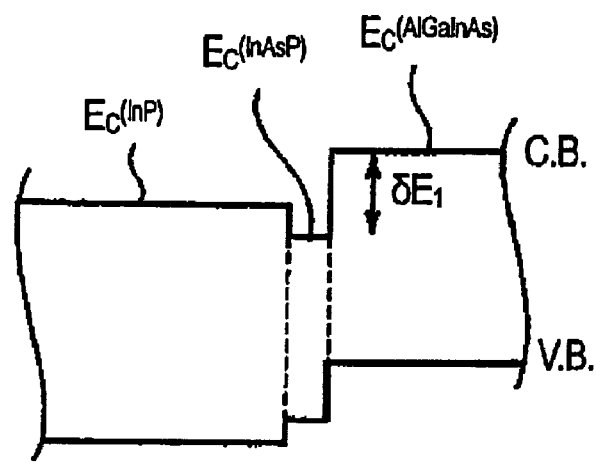
FIG. 2B is an energy band diagram of the InP/AlGaInAs system.
Figure 2C:
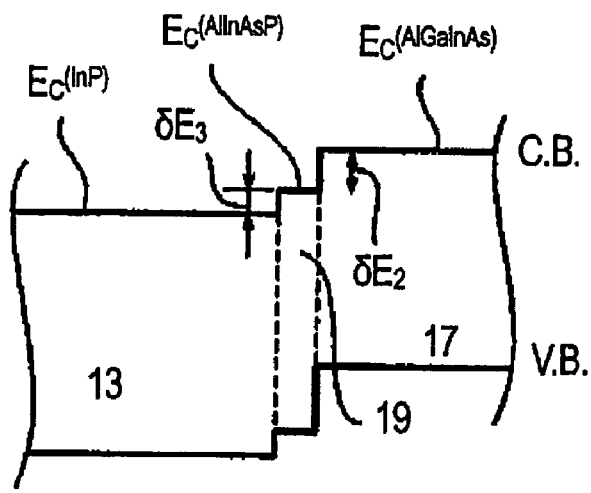
FIG. 2C is the band diagram of the laser diode shown in FIG. 1.

FIG. 2A shows a band structure of the semiconductors constituting the feedback grating in the InP/InGaAsP system, which is a typical combination in the conventional LD, FIG. 2B is that of the InP/AlGaInAs system, while, FIG. 2C is the band structure of semiconductors constituting the feedback grating according to the present invention.

When the lower SCH layer is grown, by using the Organic Metal Vapor Phase Epitaxy (OMVPE) method, onto the InP region with a mask pattern for the feedback grating, the growth temperature is raised as supplying with the phosphine ($PH_3$) to prevent the dissociation of phosphorus atoms from the surface of the InP region. However, when the temperature is raised as supplying only with the phosophine, the mass-transportation of indium atoms may occur and the feedback grading on the surface of the InP region can not be maintained. Accordingly, the conventional method for forming the feedback grating uses a mixture of the phosphine and the arsine ($AsH_3$) during the raising of the temperature. That is, in the conventional structure, the InAsP reformed layer is naturally formed on the InP region as supplying with the mixture of the phosphine and the arsine. Conventionally, the InGaAsP layer is grown thereon to form the feedback grating 23. The method of growing the InGaAsP layer as supplying with the mixture of the phosphine and the arsine prevents the resistance of the InGaAsP layer along the stack of the layers from increasing.

However, in the case that the feedback grating uses the AlGaInAs lower SCH layer substituting for the InGaAsP of the conventional structure, and the AlGaInAs layer is grown after the raising of the temperature as supplying with the mixture of the arsine and the phosphine, and the InAsP layer is naturally grown, the relation of the bottom level of the conduction band between the InAsP layer and the AlGaInAs layer becomes unfavorable for the carrier conduction.

As shown in FIG. 2B, since the bottom level of the conduction band of the InAsP layer, $E_C^{(InAsP)}$, becomes lower than that of the InP region, $E_C^{(InP)}$, a difference $\delta E1$ of the bottom levels of the conduction band between the InAsP layer, $E_C^{(InAsP)}$, and the AlGaInAs layer, $E_C^{(AlGaInAs)}$, increases. On the other hand in the present invention, the surface of the InP region is covered by the AlInAsP layer during the raising of the growth temperature by supplying, in addition to the arsine and the phosphine, an aluminum containing source such as trimethylaluminum (TMAl) or triethylaluminum (TEAl). After covering the surface of the InP region by the AlInAsP intermediate layer, the AlGaInAs is grown. Since the AlInAsP is applied substituting for the InAsP, the band structure of semiconductor layers, especially that of the bottom level of the conduction bands, becomes that shown in FIG. 2C. That is, the bottom level of the conduction band of the AlInAsP, $E_C^{(AlInAsP)}$, may be close to that of the InP, $E_C^{(InP)}$, and the former level, $E_C^{(AlInAsP)}$, may be higher than the latter level, $E_C^{(InP)}$, which decreases the difference of the bottom levels of the conduction band between the AlGaInAs, $E_C^{(AlGaInAs)}$, and the AlInAsP, $E_C^{(AlInAsP)}$.

As shown in FIG. 2C, the band structure according to the present invention, the bottom level of the conduction band of the AlInAsP layer, $E_C^{(AlInAsP)}$, lies between that of the AlGaInAs layer, $E_C^{(AlGaInAs)}$, and that of the InP region, $E_C^{(InP)}$. Accordingly, the resistance inherently attributed to the band discontinuity $\delta E_1$ between the InP region 13 and the AlInAsP layer 19, as well as that, $\delta E_3$, between the AlInAsP layer 19 and the AlGaInAs 17 layer may be suppressed.

The thickness of the AlInAsP layer 19 may be thinner than 10 nm, which does not affect the optical structure between the AlGaInAs layer 17 and the InP region 13, in particular the refractive indices thereof.

Moreover, the band gap wavelength of the AlGaInAs layer 17 may be longer than 1.2 μm. Here, the band gap wavelength corresponds to the energy of the fundamental absorption edge of the semiconductor materials. When the band gap wavelength is shorter than 1.2 μm, the band structure between the InP region 13 and the AlGaInAs layer 17 may be preferable, in particular, the relation between the bottom levels of the conduction band in each layer.

Referring to FIG. 1 again, the LD 11 includes a mesa stripe 27 comprising the p-type III-V layer 15, the AlGaInAs lower SCH layer 17, the AlInAsP layer 19, the active layer 21, and the upper SCH layer 25. The mesa stripe 27 is buried by a semiconductor region 29 that may be an InP doped with iron (Fe). On the mesa stripe 27 as well the semiconductor region 29 is formed with an upper cladding layer 31 and a contact layer 33 each made of p-type III-V compound semiconductor material. The former layer 31 may be made of a p-type InP, while the contact layer 33 may be made of a p-type InGaAs. An anode electrode 35 is formed on the contact layer 33, while in a back surface of the InP region 13 is provided with a cathode electrode 37.

The LD 11 of the present invention forms the AlInAsP layer 19, substituting the InAsP intermediate layer in the conventional configuration, to smoothly connect the band structure of the InP region to the AlGaInAs layer, which suppresses the increase of the inherent resistance of the semiconductor stacking. The practical resistance of the stack shown in FIG. 2C was 6Ω, while that of FIG. 2B was 2Ω at 25° C. Moreover, the AlInAsP layer is grown on the undulated surface of the InP region, the mass-transportation of indium atoms, which may occur on the surface of the InP, may be prohibited and, accordingly, the feedback grating may be secured in its undulated shape.

Second Embodiment

Figure 3A:
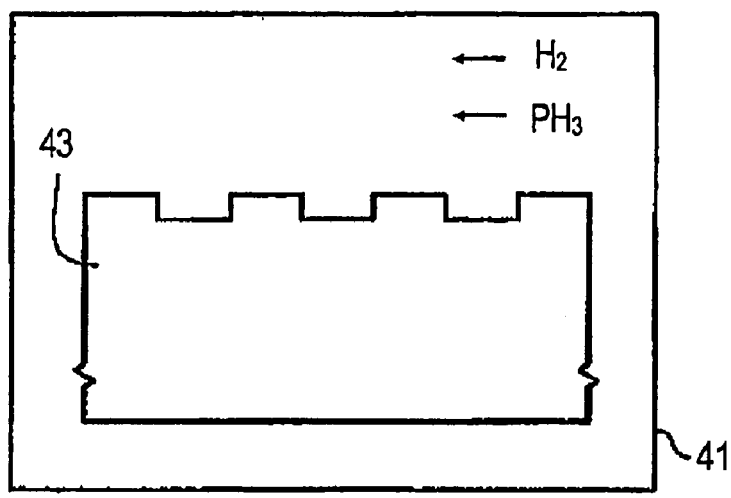
FIG. 3A shows a process to raise the temperature of the growth chamber, which prevent phosphorus atoms from dissociating from the InP surface.
Figure 3B:
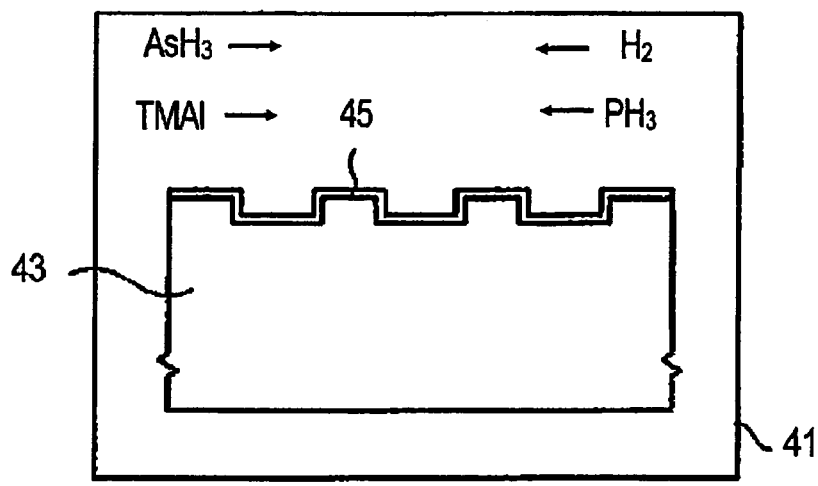
FIG. 3B shows a process to raise the temperature, which prevents the mass transportation of indium atoms.
Figure 3C:
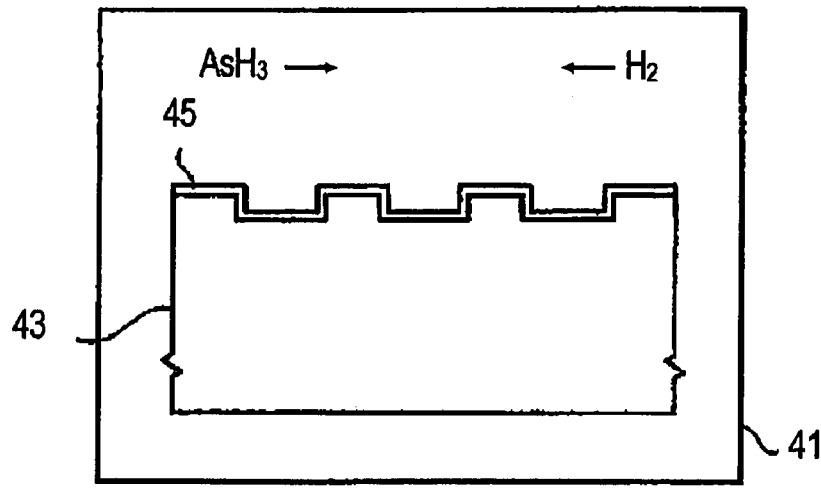
FIG. 3C shows a process to raise the temperature after forming the intermediate layer.

From FIGS. 3A to 3C, from FIGS. 4A to 4C, and FIGS. 5A and 5B show processes to form the LD of the present embodiment shown in FIG. 1.

At a step shown in FIG. 3A, the InP substrate 43 that forms an undulation for the feedback grating is set within a growth chamber 41. Raising the temperature of the substrate 43 as supplying only with the hydrogen gas ($H_2$) into the chamber 41, and when the temperature is close to a condition where the dissociation of the phosphorus atoms from the surface of the InP substrate 43, the phosphine ($PH_3$) in addition to the hydrogen is supplied within the chamber 41 to prevent the dissociation thereof. Further raising the temperature and the temperature approaches a condition that the mass-transportation may occur, the arsine ($AsH_3$) and an organoaluminum source, for instance TMAl, are started in addition to the hydrogen and the phosphine to growth the surface of the InP substrate 43 and to obtain the intermediate layer of the AlInAsP, as shown in FIG. 3B. After growing the layer 45, the TMAl is stopped and the temperature is raised to a condition to grow the AlGaInAs—SCH layer as supplying with the mixture of the hydrogen, the phosphine, and the arsine.

The AlGaInAs SCH layer 47 is grown to from the feedback grating after the temperature of the chamber reaches the preset condition and becomes sufficiently stable. After the growth of the AlGaInAs—SCH layer 47, the temperature is further raised to a condition under which the active layer is grown. After the condition is obtained, another AlGaInAs for the active layer 49 is grown. Subsequently, the upper SCH layer 51 made of AlGaInAs, and the p-type InP upper cladding layer 53 are grown in successive under respective optimal growth condition.

Figure 4A:
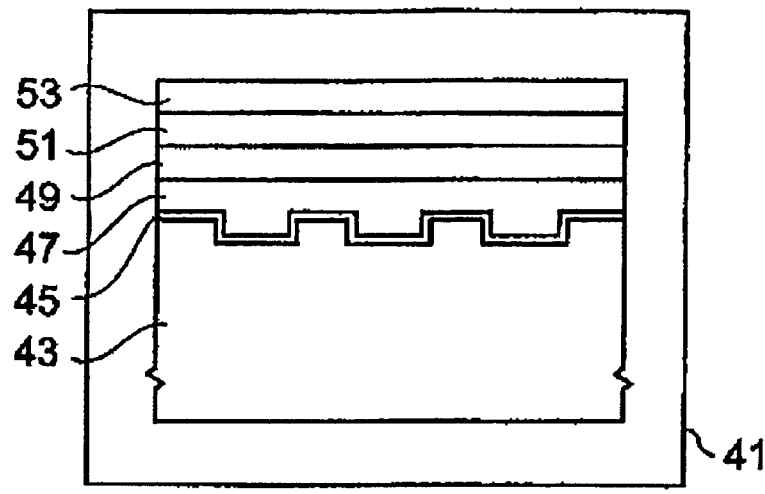
FIG. 4A shows a process for epitaxially growing a stack of semiconductor films.
Figure 4B:
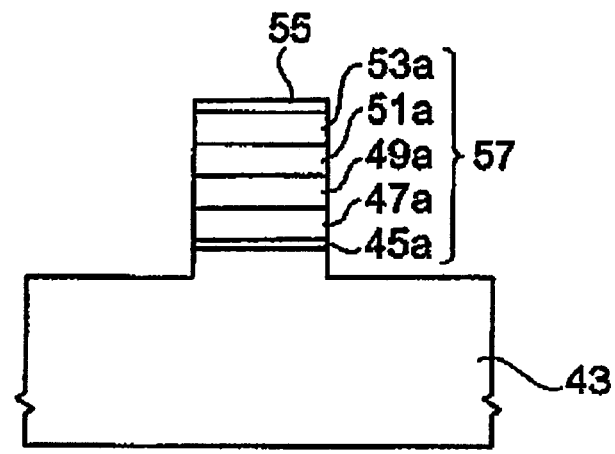
FIG. 4B shows a process for forming the mesa stripe.
Figure 4C:
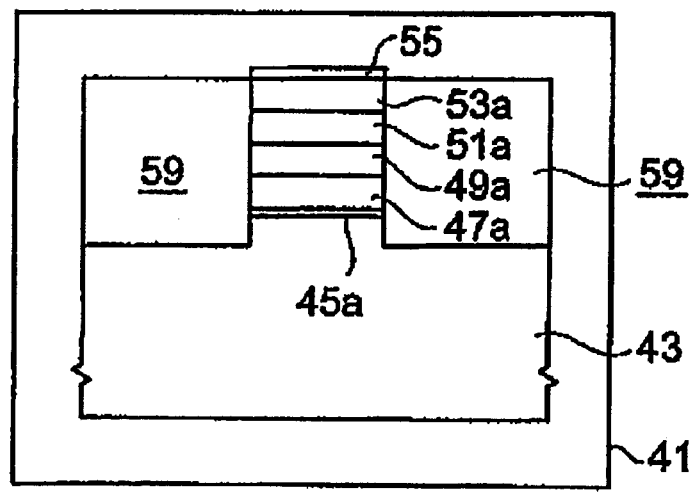
FIG. 4C shows a process to bury the mesa stripe.

Next, as shown in FIG. 4B, a stack of semiconductor layers from 43 to 53 is etched by using an etching mask 55 to form the mesa stripe 57. The mesa stripe 57 includes a portion of the InP substrate 43a, the AlInAsP layer 45a, the AlGaInAs lower SCH layer 47a, the AlGaInAs active layer 49a, the AlGaInAs upper SCH layer 51a, and the p-type upper cladding layer 53a.

Both sides of the mesa stripe 57 is buried by the semiconductor material 59 without removing the etching mask 55 after the semiconductor stack, the substrate 43a with the mesa stripe 57, is put back within the growth chamber 41. After the growth of the side regions 59, the etching mask 55 is removed.

Figure 5A:
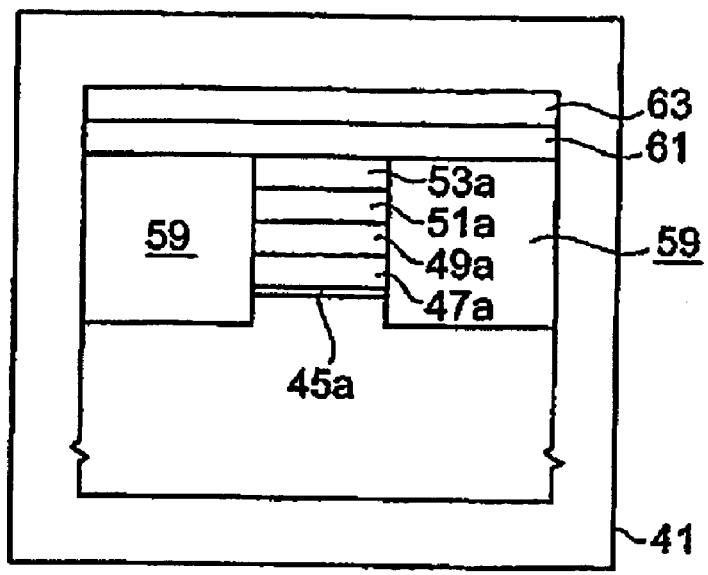
FIG. 5A shows a process for forming the contact layer.
Figure 5B:
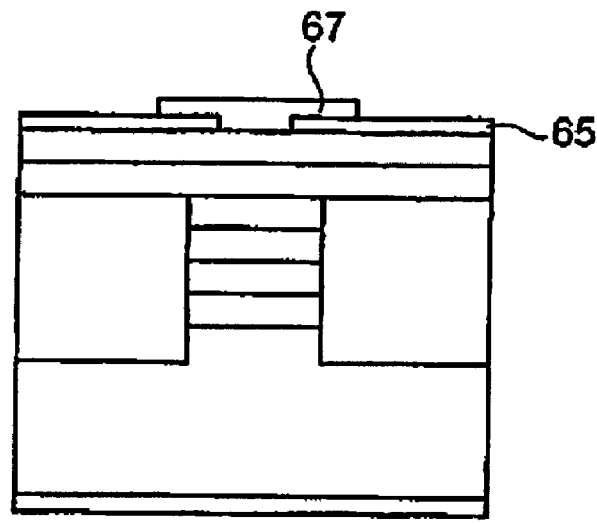
FIG. 5B shows a process for forming electrodes.

Loading the substrate 43a with the mesa stripe 57 and the side regions 59 into the chamber 41 again, a part of the upper cladding layer 61, which may be made of the p-type InP, and the contact layer 63 are grown as shown in FIG. 5A. Two electrodes of the anode 67 and the cathode 69 are formed on the contact layer 63 and the bottom surface of the InP substrate 43a, respectively. The anode 67 is formed via a passivation film 65 made of insulating material such as silicon nitride (SiN) with an opening from which the surface of the contact layer 63 is exposed.

Figure 6:
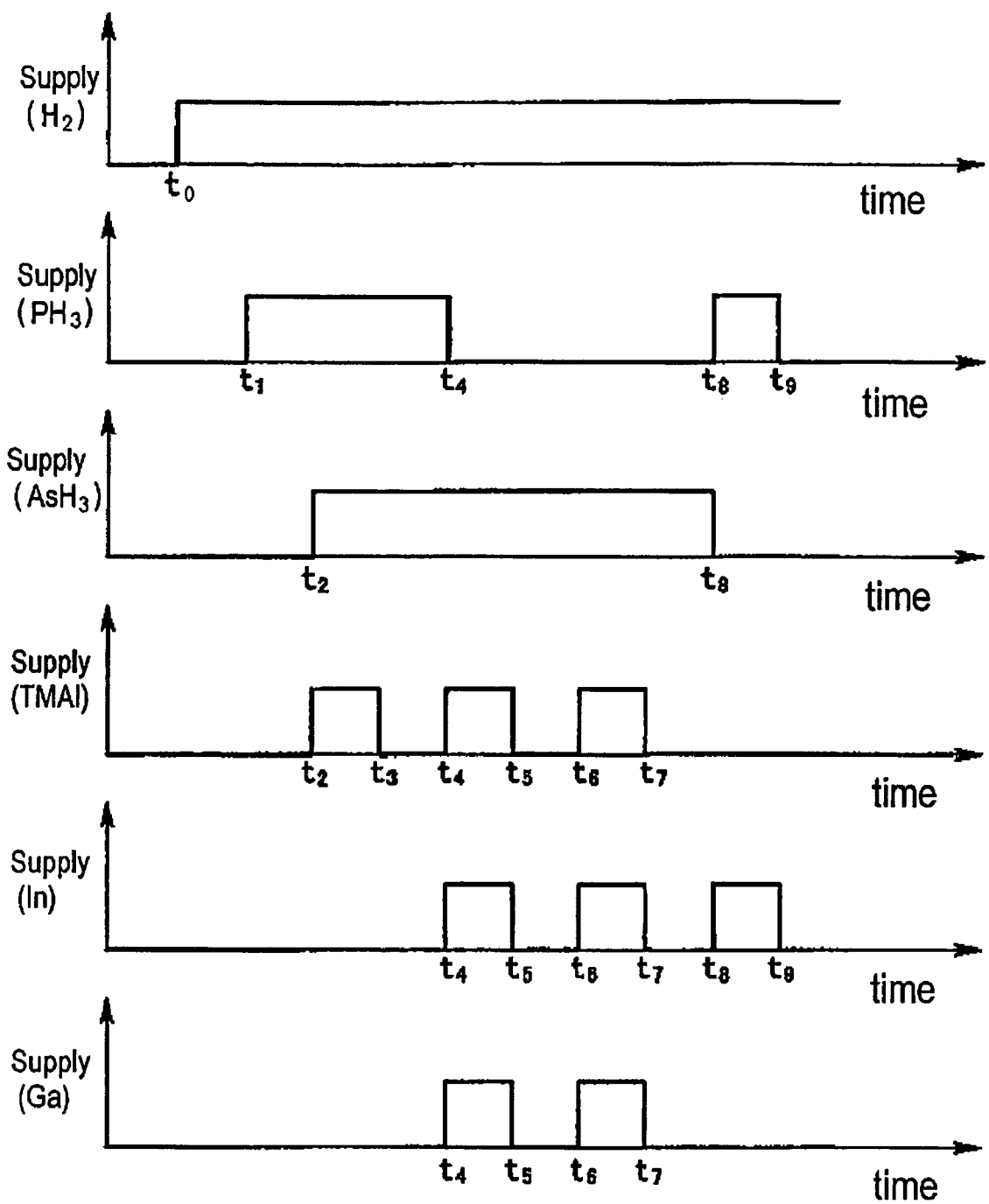
FIG. 6 is a time chart showing a sequence of supplying gas sources.

Referring to FIG. 6, a sequence of the epitaxial growth of the present invention, in particular the sequence of the supply of gaseous sources will be described. First, the InP substrate with the undulated structure for the feedback grating is loaded into the growth chamber of the OMVPE apparatus. The pressure of the growth is 60 Torr (8000 Pa). At the time t0, the temperature of the chamber is raised to 400° C. as supplying with the hydrogen $H_2$. The flow rate of the hydrogen may be, for example, 10 slm (standard litter per minutes). At 400° C., the phosphine ($PH_3$) is supplied in addition to the hydrogen ($H_2$) within the chamber at the timing t1 to control the dissociation of the phosphorus (P) from the InP substrate. The flow rate of the phosphine ($PH_3$) may be, for example, 50 sccm (standard cc per minutes). At the temperature being 450° C., the arsine ($AsH_3$) and the TMAl are further supplied within the chamber at the time t2 to grow the AlInAsP intermediate layer with a preferable thickness. The flow rate of the arsine ($AsH_3$) is, for example, 0.5 sccm, while that of the TMAl is, for example, 20 sccm. In the present embodiment, the mixed gas of the hydrogen ($H_2$), the phosphine ($PH_3$), the arsine ($AsH_3$), and the TMAl is supplied for about 3 seconds from t2 to t3 in FIG. 6, to obtain the intermediate layer of the AlGaInAs with a thickness of about 1 nm. The TMAl is ceased its supply at the time t3. Subsequently, the temperature is raised to 550° C. from t3 to t4 as supplying a mixture of the phosphine $PH_3$ and the arsine $AsH_3$. At 550° C., the AlGaInAs layer is grown from t4 to t5. Subsequently, the temperature is raised again from t5 to t6 to 700° C. as supplying only the arsine ($AsH_3$) to grow the AlGaInAs active layer at 700° C. After the AlGaInAs active layer is grown from t6 to t7 at 700° C., the temperature is fallen to 670° C. from t7 to t8 as supplying only with the arsine ($AsH_3$). At 670° C., the InP cladding layer is grown from t8 to t9.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A method for manufacturing a semiconductor laser diode with a feedback grating, comprising steps of:
   forming an undulation on a surface of a semiconductor substrate;
   epitaxially growing an intermediate layer onto the undulated surface of the substrate so as to leave the undulation; and
   epitaxially growing a semiconductor layer to bury the undulation formed on the surface of the substrate to make a surface of the semiconductor layer substantially flat.

2. The method according to claim 1,
   wherein the substrate, the intermediate layer, and the semiconductor layer are InP, AlInAsP, and AlGaInAs, respectively.

3. The method according to claim 2,
   wherein the step of forming the AlInAsP intermediate layer is carried out by supplying arsine, phosphine, and organoaluminum.

4. The method according to claim 1,
   wherein, after forming the undulation and before growing the intermediate layer, the temperature of the substrate is raised to a first preset temperature as supplying hydrogen, and subsequently raised to a second preset temperature higher than the first preset temperature as supplying hydrogen and phosphine.

5. The method according to claim 4,
   wherein the growth of the intermediate layer is carried out at the second present temperature as supplying hydrogen, phosphine, arsine and organoaluminum.

6. The method according to claim 4,
   wherein, after growing the intermediate layer and before growing the semiconductor layer, the temperature of the substrate is raised to a third preset temperature higher than the second preset temperature as supplying hydrogen, phoshine, and arsine.

* * * * *